(12) United States Patent
Uzoh et al.

(10) Patent No.: US 9,560,773 B2
(45) Date of Patent: *Jan. 31, 2017

(54) ELECTRICAL BARRIER LAYERS

(71) Applicant: Tessera, Inc., San Jose, CA (US)

(72) Inventors: Cyprian Uzoh, San Jose, CA (US);
Vage Oganesian, Palo Alto, CA (US);
Ilyas Mohammed, Santa Clara, CA (US);
Belgacem Haba, Saratoga, CA (US);
Piyush Savalia, Santa Clara, CA (US);
Craig Mitchell, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/809,117

(22) Filed: Jul. 24, 2015

(65) Prior Publication Data

US 2015/0334829 A1    Nov. 19, 2015

Related U.S. Application Data

(63) Continuation of application No. 13/183,870, filed on Jul. 15, 2011, now Pat. No. 9,125,333.

(51) Int. Cl.
*H05K 1/03* (2006.01)
*H05K 1/09* (2006.01)
*H05K 3/40* (2006.01)
*H01L 23/00* (2006.01)

(52) U.S. Cl.
CPC .......... *H05K 3/4007* (2013.01); *H01L 24/05* (2013.01); *H05K 1/09* (2013.01); *H01L 2224/04042* (2013.01); *H01L 2224/056* (2013.01); *H01L 2224/05083* (2013.01); *H01L 2224/05139* (2013.01); *H01L 2224/05144* (2013.01); *H01L 2224/05147* (2013.01); *H01L 2224/05155* (2013.01); *H01L 2224/05164* (2013.01); *H01L 2224/05169* (2013.01); *H01L 2924/013* (2013.01); *H01L 2924/01005* (2013.01); *H01L 2924/01006* (2013.01); *H01L 2924/01015* (2013.01); *H01L 2924/01074* (2013.01); *H05K 2201/0326* (2013.01); *H05K 2201/0338* (2013.01)

(58) Field of Classification Search
CPC ............ H01L 2224/04042; H01L 2224/05083; H01L 2224/05139; H01L 2224/05144; H01L 2224/05147; H01L 2224/05155; H01L 2224/05164; H01L 2224/05169; H01L 2224/056; H01L 24/05; H01L 2924/01005
USPC ......... 174/255, 256, 259–264, 257; 257/737, 257/736, 738, 646, 635, 751; 428/663, 428/665, 671–680
See application file for complete search history.

(56) References Cited

U.S. PATENT DOCUMENTS

| | | |
|---|---|---|
| 4,626,479 A | 12/1986 | Hosoi et al. |
| 6,180,505 B1 | 1/2001 | Uzoh |
| 6,312,832 B1 | 11/2001 | Alperine et al. |

(Continued)

*Primary Examiner* — Yuriy Semenenko
(74) *Attorney, Agent, or Firm* — Haynes and Boone, LLP

(57) ABSTRACT

An electrical connection structure includes a variable-composition nickel alloy layer with a minor constituent selected from a group consisting of boron, carbon, phosphorus, and tungsten, wherein at least over a portion of a conductive substrate, the concentration of the minor constituent decreases throughout the variable-composition nickel alloy layer in a direction from the bottom surface of the variable-composition nickel alloy layer to the top surface of the variable-composition nickel alloy layer.

2 Claims, 8 Drawing Sheets

(56) References Cited

U.S. PATENT DOCUMENTS

| | | |
|---|---|---|
| 7,521,128 B2 | 4/2009 | Schuh et al. |
| 2005/0215045 A1 | 9/2005 | Rinne et al. |
| 2006/0199379 A1* | 9/2006 | Yeh .................. H01L 21/31144 |
| | | 438/638 |
| 2007/0267749 A1 | 11/2007 | Stecher et al. |
| 2008/0308938 A1 | 12/2008 | Yu |
| 2009/0065907 A1 | 3/2009 | Haba et al. |
| 2010/0237502 A1 | 9/2010 | Yu et al. |
| 2011/0048774 A1 | 3/2011 | Sato et al. |
| 2011/0080186 A1 | 4/2011 | Sugihara |
| 2013/0014979 A1 | 1/2013 | Uzoh et al. |

* cited by examiner

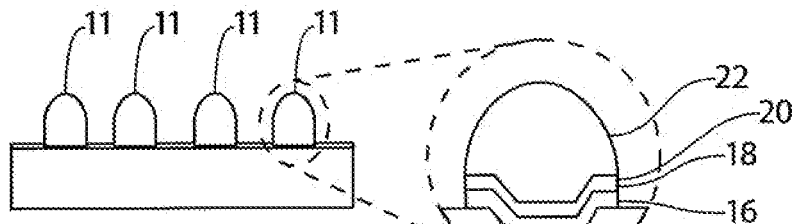
FIG. 1A
"Prior Art"
FIG. 1B
"Prior Art"
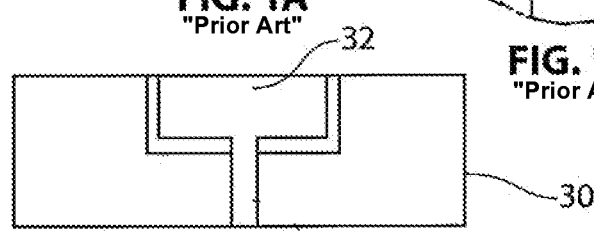
FIG. 2A
"Prior Art"
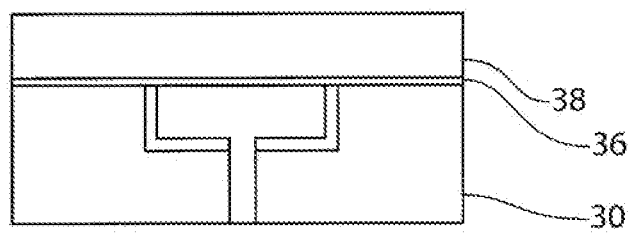
FIG. 2B
"Prior Art"
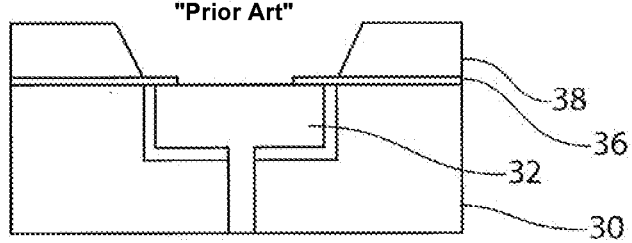
FIG. 2C
"Prior Art"
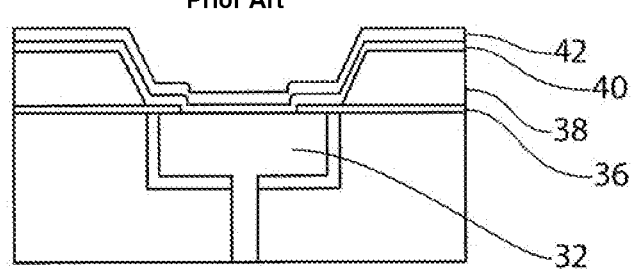
FIG. 2D
"Prior Art"

ELECTRICAL BARRIER LAYERS

CROSS-REFERENCE TO RELATED APPLICATIONS

The present application is a continuation of U.S. patent application Ser. No. 13/183,870, filed Jul. 15, 2011, incorporated herein by reference, now U.S. Pat. No. 9,125,333.

BACKGROUND OF THE DISCLOSURE

Barrier layers can be used in myriad electrical connections in a variety of electrical applications. For example, a barrier layer can be used in semiconductor applications to prevent diffusion of the materials adjacent the barrier layer. For example, a barrier layer can be used to prevent diffusion between a substrate layer and an adhesion layer. Barrier layers can also be used to promote the adhesion (i.e., the wetting characteristic) between two or more materials, such as between a substrate layer and an adhesion layer. Barrier layers can be also used in, for example without limitation, semiconductor chip structures, packaging, flat panel applications, and magnetics.

In order to minimize the overall size of the electronic structure in which the barrier layer is used (e.g., an interconnect structure) and to reduce manufacturing costs, it would be beneficial to incorporate barrier layers that are thinner than traditional barrier layers yet retain the functionality of the barrier layer, such as preventing diffusion of the layers adjacent the barrier and providing adhesion.

SUMMARY OF THE DISCLOSURE

One aspect of the disclosure is a conductive pad adapted to create an electrical connection, comprising a conductive substrate, a variable-composition nickel alloy layer disposed above the conductive substrate, and a conductive layer disposed above the variable-composition nickel alloy layer.

In some embodiments the variable-composition nickel alloy layer has a variable nickel concentration within the layer. The nickel concentration can vary between about 80% and 100% within the layer.

In some embodiments the variable-composition nickel alloy layer has a variable boron concentration within the layer. The boron concentration can vary between about 0% and about 5% within the layer. The nickel-alloy layer can have first and second surfaces, the first surface being closer to the substrate than the second surface, and wherein the concentration of boron is higher at the first surface than the boron concentration at the second surface.

In some embodiments the variable-composition nickel alloy layer comprises a minor constituent whose concentration varies linearly throughout the alloy layer.

In some embodiments the variable-composition nickel alloy layer comprises a minor constituent whose concentration varies non-linearly throughout the alloy layer.

In some embodiments the variable-composition nickel alloy has a variable carbon concentration within the layer. The carbon concentration can vary between about 0% and about 5% within the layer.

In some embodiments the pad further comprises a nickel layer disposed on the conductive substrate, wherein the variable-composition nickel alloy layer is disposed on the nickel layer. The conductive layer can be disposed on the variable-composition nickel alloy layer. A second nickel layer can be disposed on the variable-composition nickel alloy layer, wherein the conductive layer is disposed on the second nickel layer. In some embodiments the combined depths of the nickel layer, variable-composition nickel alloy layer, and second nickel layer is between about 0.01 and 1.5 microns. The nickel layer can have a thickness of between about 5 nm and about 50 nm.

In some embodiments the pad further comprises a nickel layer disposed on the variable-composition nickel alloy layer. The variable-composition nickel alloy layer can be disposed on the conductive substrate. The conductive layer can be disposed on the nickel layer. The pad can further comprise a second variable-composition nickel alloy layer disposed on the nickel layer. The combined thicknesses of the variable-composition nickel alloy layer, nickel layer, and second variable-composition nickel alloy layer can be between about 0.01 and about 1.5 microns.

In some embodiments a thickness between the conductive substrate and the conductive layer is between about 0.01 and about 1.5 microns.

In some embodiments a thickness of the nickel alloy layer is between about 20 and about 200 nm.

In some embodiments the conductive layer is a solder material.

One aspect of the disclosure is a method of preparing a conductive pad as an electrical connection, comprising providing a conductive substrate, plating a variable-composition nickel alloy layer above the conductive substrate, and plating a conductive layer above the variable-composition nickel alloy layer.

In some embodiments plating a variable-composition nickel alloy layer comprises plating the layer with a varying concentration of nickel within the layer.

In some embodiments plating a variable-composition nickel alloy layer comprises plating the layer with a varying concentration of boron within the layer. Plating the layer with a varying concentration of boron within the layer can comprise plating the layer such that the boron varies between a concentration of about 0% and about 5% within the layer.

In some embodiments plating the variable-composition nickel alloy layer comprises plating a higher concentration of a minor constituent closer to the conductive substrate than the conductive layer. The plating step can comprise plating a higher concentration of boron closer to the conductive substrate than the conductive layer.

In some embodiments plating a variable-composition nickel alloy layer comprises plating the layer with a varying concentration of carbon within the layer, such as between about 0% and about 5% within the layer.

In some embodiments plating a variable-composition nickel alloy layer comprises exposing the nickel alloy to at least one of oxygen and nitrogen gas. Exposing the nickel alloy to at least one of oxygen and nitrogen gas can comprise modulating the amount of nitrogen gas to which the alloy is exposed to vary the concentration of nickel that is deposited. Exposing the nickel alloy to at least one of oxygen and nitrogen gas comprises modulating the amount of oxygen gas to which the alloy is exposed to vary the concentration of nickel that is deposited. Exposing the nickel alloy to at least one of oxygen and nitrogen gas can comprise modulating the amount of nitrogen gas to which the alloy is exposed to vary the concentration of boron that is deposited. Exposing the nickel alloy to at least one of oxygen and nitrogen gas comprises modulating the amount of oxygen gas to which the alloy is exposed to vary the concentration of boron that is deposited.

In some embodiments the method further comprises plating a nickel layer above the conductive substrate. Plating a nickel layer can comprise plating a nickel layer on the conductive substrate, wherein the variable-composition nickel alloy layer is plated on the nickel layer. The method can also include plating a second nickel layer on the variable-composition nickel alloy layer. Plating the conductive layer can comprise plating a gold layer on the second nickel layer. Plating the nickel layer can comprise plating the nickel layer on the variable-composition nickel alloy layer. A second variable-composition nickel alloy layer can be plated on the nickel layer. Plating the conductive layer can comprise plating the conductive layer on the second variable-composition nickel alloy layer. Plating the nickel layer can comprise flash plating the nickel layer to a thickness of about 5 nm to about 50 nm.

In some embodiments the method further comprises creating a thickness between the conductive substrate and the conductive layer that is about 0.01 microns to about 1.5 microns.

In some embodiments plating a variable-composition nickel alloy layer comprises plating a variable-composition nickel alloy layer that is about 20 to about 200 nm thick.

One aspect of the disclosure is a conductive pad adapted to create an electrical connection, comprising a conducting substrate, a nickel layer disposed on the conducting substrate, a nickel alloy layer disposed on the nickel layer, and a conductive layer disposed above the nickel alloy layer.

In some embodiments a second nickel layer is disposed on the nickel alloy layer and under the conductive layer. The conductive layer can be disposed on the second nickel layer. The combined depths of the nickel layer, nickel alloy layer, and second nickel layer can be between about 0.01 and about 1.5 microns.

In some embodiments the nickel alloy layer is a nickel-boron alloy. The boron can be present in the amount from about 0% to about 5% by weight.

In some embodiments the nickel alloy layer is a nickel-carbon alloy. The carbon can be present in the amount from about 0% to about 5% by weight.

In some embodiments the nickel layer has a thickness of about 5 to about 50 nm.

In some embodiments the conducting substrate is a copper layer.

In some embodiments the nickel alloy layer is a variable-composition nickel alloy layer. The nickel alloy layer can have a variable nickel concentration within the layer. The nickel alloy layer can have a variable boron concentration within the layer. The nickel alloy layer can have a variable carbon concentration within the layer.

In some embodiments the nickel alloy layer has a thickness of between about 20 and about 200 nm.

In some embodiments the conductive layer is a solder material.

One aspect of the disclosure is a conductive pad adapted to create an electrical connection, comprising a conducting substrate, a nickel alloy layer disposed on the conducting substrate, a nickel layer disposed on the nickel alloy layer, and a conductive layer disposed above the nickel layer. The pad can also include a second nickel alloy layer disposed on the nickel layer. The conductive layer can be disposed on the second nickel alloy. The combined thickness of the nickel alloy layer, nickel layer, and second nickel alloy layer can be between about 0.01 and about 1.5 microns.

In some embodiments the nickel alloy layer is a nickel-boron alloy. The boron can be present in the amount from about 0% to about 5% by weight.

In some embodiments the nickel alloy layer is a nickel-carbon alloy. The carbon can be present in the amount from about 0% to about 5% by weight.

In some embodiments the nickel layer has a thickness of about 5 nm to about 50 nm.

In some embodiments the conducting substrate is a copper layer.

In some embodiments the nickel alloy layer is a variable-composition nickel alloy layer. The nickel alloy layer can have a variable nickel concentration within the layer. The nickel alloy layer can have a variable boron concentration within the layer. The nickel alloy layer can have a variable carbon concentration within the layer.

In some embodiments the conductive layer is a solder material.

In some embodiments the nickel alloy layer has a thickness of about 20 nm to about 200 nm.

One aspect of the disclosure is a conductive pad adapted to create an electrical connection, comprising a copper substrate, a nickel layer disposed on the conducting substrate, a nickel-boron layer disposed on the nickel layer, and a conductive layer disposed above the nickel layer.

In some embodiments the nickel layer has a thickness of about 5 nm to about 50 nm.

In some embodiments the nickel boron layer has a thickness of about 20 nm to about 200 nm.

In some embodiments a distance between the copper substrate and the conductive layer is about 0.01 microns to about 1.5 microns.

INCORPORATION BY REFERENCE

All publications and patent applications mentioned in this specification are herein incorporated by reference to the same extent as if each individual publication or patent application was specifically and individually indicated to be incorporated by reference.

BRIEF DESCRIPTION OF THE DRAWINGS

A better understanding of the features and advantages of the present disclosure will be obtained by reference to the following detailed description that sets forth illustrative embodiments, in which the principles of the disclosure are utilized, and the accompanying drawings of which:

FIGS. 1A and 1B illustrate exemplary prior art metal connectors that can be used in semiconductor applications.

FIGS. 2A-2F illustrate a traditional exemplary method of manufacturing electrical connections for semiconductor chip packaging.

DETAILED DESCRIPTION

Figure 2E:
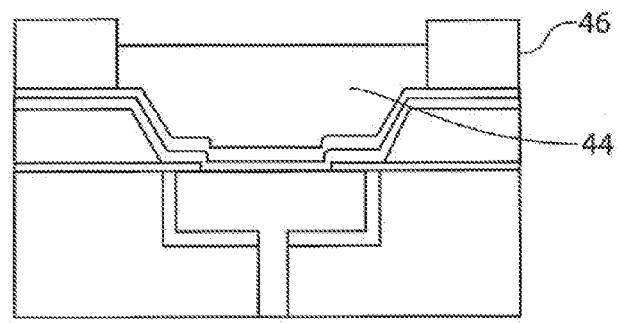

The disclosure is related to electrical connections and their methods of manufacture. In particular, the disclosure describes barrier layers that can be incorporated into a wide variety of electrical connections. For example, the barrier layers can be used in any electrical connector in semiconductor applications, packaging applications, magnetic and flat panel applications. Barriers layers described herein provide the benefit of being thinner than traditional barrier layers, yet still provide the benefits of the barrier layer, such as preventing the diffusion of materials adjacent the barrier layer, providing adequate adhesion of materials adjacent the barrier layer, etc.

FIGS. 1A and 1B illustrate exemplary prior art metal connectors 11 that can be used in semiconductor applications. FIG. 1B highlights individual layers in connectors 11. Connectors 11 include substrate 16, barrier 18, adhesion layer 20, and solder bump 22. Connectors 11 also include dielectric 12 and metal wiring 14.

FIGS. 2A-2F illustrate an exemplary traditional method of manufacturing electrical connections, such as can be found in, for example without limitation, semiconductor chip packaging. In FIG. 2A, substrate 32 is deposited on dielectric 30. In FIG. 2B, passivation layer 36 is coated on substrate 32 and dielectric 30, and polymeric material 38 is deposited on passivation layer 36. In FIG. 2C, polymer 38 has been cured, lithographically patterned, and portions of polymer 38 and passivation layer 36 have been removed by reactive ion etching ("RIE") methods to expose a portion of substrate 32 underneath.

Figure 2F:
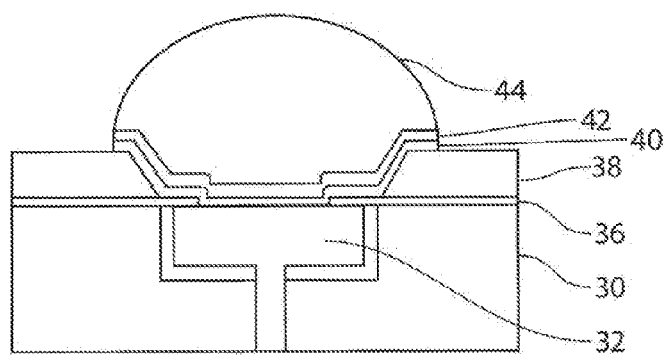

In FIG. 2D, the patterned surface is coated with a suitable barrier layer 40 and seed layer 42. In FIG. 2E, resist 46 has been applied to the surface and patterned, after which solder material 44 is deposited within the cavity defined by resist 46 and seed layer 42. As shown in FIG. 2F, after resist 46 has been stripped, and portions of barrier 40 and seed layer 42 removed, the solder is reflowed to form a solder bump as shown.

Figure 3:
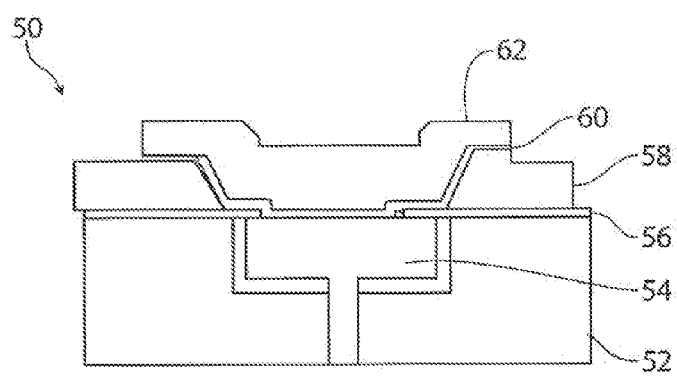
FIG. 3 illustrates a conventional prior art wire bond connector.

FIG. 3 illustrates a conventional prior art wire bond connector. Connector 50 includes dielectric 52, substrate 54, passivation layer 56, polymer 58, barrier 60, and conductor 62. In some conventional embodiments the barrier layer is a titanium-tungsten layer, and the conductor is an aluminum copper alloy layer.

Figure 4A:
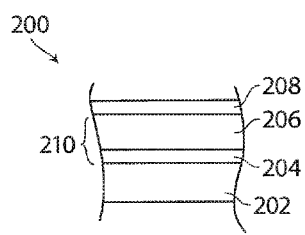
FIGS. 4A-5B illustrate exemplary connectors with laminated barrier layers.

One aspect of the disclosure provides for laminated barrier layers, that is, one or more discrete layers within the overall barrier structure. The laminated barrier layers include at least one alloy layer. FIG. 4A illustrates an exemplary connector (or a portion of a connector) with a laminated barrier layer. Connector 200 includes substrate 202, barrier 210, and conductive layer 208. Barrier 210 includes first barrier layer 204 and second barrier layer 206. In one exemplary embodiment, first barrier layer 204 is a nickel layer, and second barrier layer 206 is a nickel-boron alloy layer.

Boron in the nickel-boron alloy tends to increase the barrier layer's ability to resist corrosion in the substrate layer. As the amount of boron increases, however, the interface between the substrate and barrier tends to undesirably become more brittle. It is generally better to make any boron containing alloy layers as thin as possible to decrease the brittleness of the substrate/barrier interface. Additionally, as in the embodiment in FIG. 4A, the very thin barrier layer 204, which does not include boron, eliminates the presence of boron at the substrate/barrier interface, thereby significantly reducing the likelihood of cracks at the substrate/barrier interface. Additionally, keeping first barrier layer 204 very thin helps keep the overall barrier layer very thin.

Figure 4B:
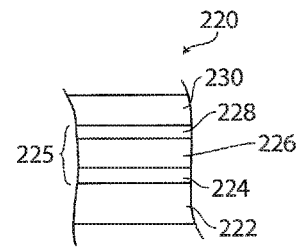

FIG. 4B illustrates an alternative embodiment of a connector. Connector 220 includes substrate 222, barrier 225, and conductive layer 230. Laminated barrier layer 225 includes first layer 224, second layer 226, and third layer 228. In one exemplary embodiment, first layer 224 is nickel, second layer 226 is a nickel-boron alloy, and third layer 228 is nickel, forming a Ni/NiB/Ni laminated barrier layer. In some embodiments layer 224 has a thickness between about 5 nm and about 50 nm. In some embodiments layer 226 has a thickness between about 20 nm about 200 nm. In some embodiments layer 228 has a thickness between about 3 nm about 50 nm. Layer 228 can have a minimum thickness of about 3 nm because the layer should have (in this embodiment) a continuous layer of material without creating gaps in the layer, which produces "islands" in the layer. When the thickness is below 3 nm, it can be difficult (depending on the process used) to satisfactorily create a continuous layer of material without creating "islands." The minimum acceptable thickness, however, will depend on the method of producing the layer, and 3 nm is illustrative and not intended to be limiting.

Figure 5A:
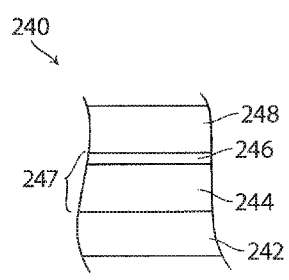

FIG. 5A illustrates an exemplary connector. Connector 240 includes substrate 242, barrier layer 247, and conductive layer 248. Barrier layer 247 includes first layer 244 and second layer 246. In one exemplary embodiment, first layer 244 is a nickel-alloy, and second layer 246 is nickel, forming a NiB/Ni laminated barrier layer.

Figure 5B:
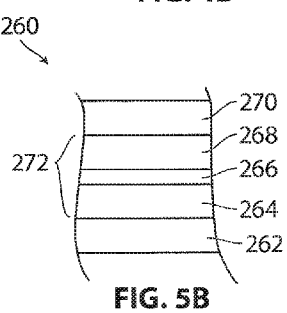

FIG. 5B illustrates an exemplary connector. Connector 260 includes substrate 262, barrier layer 272, and conductive layer 270. Barrier layer 272 includes first layer 264, second layer 266, and third layer 268. In one particular embodiment first layer 264 is a nickel-boron alloy, second layer 266 is a nickel layer, and third layer 268 is a nickel alloy, providing a NiB/Ni/NiB laminated barrier layer. In some embodiments layer 264 has a thickness between about 20 nm and about 200 nm. In some embodiments layer 266 has a thickness between about 5 nm and about 50 nm. In some embodiments layer 268 has a thickness between about 20 nm about 200 nm, and the same thickness considerations mentioned above with respect to FIG. 4B can similarly apply to the embodiment in FIG. 5B.

The conductive layer, such as layer 208, layer 230, layer 248, and layer 270, in FIGS. 4A-5B, respectively can be any suitable conductive material, such as, gold, silver, palladium, platinum, nickel, copper, copper particles, a solder material, solder paste, silver paste, conducting paste, and conducting adhesive.

The alloy layers can have a minor constituent present at a concentration from about 1% to about 49% of the alloy layer material. In some embodiments the minor constituent is about 1% to about 10% of the alloy layer material. In some embodiments the minor constituent is about 1%, about 2%, about 3%, about 4%, about 5%, about 6%, about 7%, about 8%, about 9%, or about 10% of the alloy layer material. For example, in the embodiment in FIG. 5A, first layer 244 can be an alloy with a minor constituent that is about 5% of the alloy layer material, and wherein a major constituent in about 95% of the alloy layer material. In one exemplary embodiment first layer 244 is a nickel-boron alloy, wherein the boron is about 5%, while nickel is about 95%, of alloy layer material. In an exemplary embodiment with the structure shown in FIG. 5B, first layer 264 is an alloy layer with about 2% boron and about 98% nickel, while third layer 268 is an alloy layer with about 4% boron and about 96% nickel. The disclosure is obviously not limited to using nickel as the major constituent or boron as the minor constituent. Additionally, more than 1 minor constituent can be used and can be present in a uniform concentration layer.

In embodiments in which the barrier layer has more than one alloy layer (such as in FIG. 5B), each with different concentrations of a minor constituent, the layer with a lower concentration of the minor constituent can be disposed adjacent other layers in the connector to provide added benefits. For example, if there are two layers with different concentrations of boron (but each uniform throughout), the lower boron containing layer can be used for better adhesion for the higher boron layer above or below it.

Figure 6A:
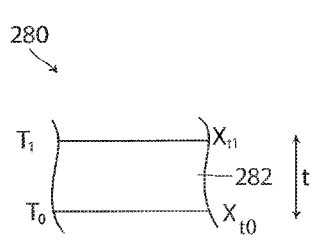
FIG. 6A illustrates an exemplary graded alloy barrier layer with a varying concentration of a minor constituent.
Figure 6B:
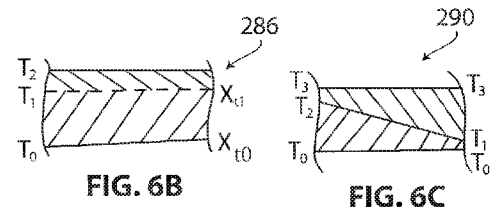
FIG. 6B illustrates a barrier layer with a first graded portion and a second uniform portion.
Figure 6C:
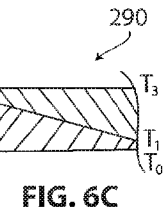
FIG. 6C illustrates a barrier layer with a first graded portion and a second uniform portion.

In some embodiments the nickel alloy layer (or other metal alloy layer) is a graded layer. That is, one or more components in the alloy layer vary in concentration throughout the thickness of the layer. FIG. 6A illustrates an exemplary alloy layer within a barrier structure (the other layers of the connector are not shown for clarity) in which the concentration of at least one component varies in the thickness, or "t", direction. In an exemplary embodiment, layer 282 is a nickel-boron alloy where nickel is the major constituent and boron in the minor constituent (i.e., nickel is present in a greater percentage than boron). The boron is graded throughout the thickness of layer 282 such that the boron concentration varies throughout thickness "t" of layer 282. In some embodiments the concentration increases towards the top surface, and in some embodiments the concentration decreases towards the top surface. In some embodiments the concentration increases from "$X_{t0}$" to "$X_{t1}$" from bottom surface "$T_0$" to top surface "$T_1$" while in some embodiment the concentration decreases from "$X_{t0}$" to "$X_{t1}$" from bottom surface "$T_0$" to top surface "$T_1$". The variation in concentration can be linear or non-linear, and the change in concentration need not extend throughout the entire thickness of the layer. In an exemplary linear variation, in FIG. 6A the minor constituent (e.g., carbon) varies linearly from between 0% and 1% at surface $T_0$ to about 5% at surface $T_1$. In an exemplary non-linear variation, in FIG. 6A the minor constituent (e.g., boron) varies in a non-linear manner (e.g., exponentially) from surface $T_0$ to surface $T_1$. In an alternative embodiment shown in FIG. 6B, alloy layer 286 has a thickness that extends from $T_0$ to $T_2$, but the concentration of the minor component only varies from "$X_{t0}$" "$X_{t1}$" from $T_0$ to $T_1$, while the concentration of the minor component is uniform from $T_1$ to $T_2$. Alternatively, the concentration of one or more components can vary between any two surfaces throughout the thickness of the layer, and can be uniform at any other location throughout the thickness of the layer. FIG. 6C illustrates an alternative alloy layer in which the varying concentration section and the uniform section create an interface that is not parallel with top and bottom surfaces of layer 290. For example, the minor component can vary in concentration from surface $T_0$ to the line connecting points $T_1$ and $T_2$, while the concentration can be uniform between $T_3$ and the line connecting points $T_1$ and $T_2$.

Any of the alloy layers described herein, including those that are simply described as part of a laminated barrier layer, can have a graded alloy layer. For example, in FIG. 5A first layer 244 can be an alloy material with major and minor constituents. In an exemplary embodiment, layer 244 is a graded nickel-boron alloy, with the concentration of boron increasing from the bottom to the top of layer 244, and wherein the concentration increases from between about 0 and 1% at the bottom to about 5% at the top of layer 244. Similar graded alloys can be used for layers 264 and 268 in the embodiment in FIG. 5B.

While nickel is generally referred to herein as a major metal constituent in the barrier layer, the alloy layer can additionally comprise other suitable metals such as, for example without limitation, cobalt and tungsten. While boron is typically referred to herein as a minor constituent, any other suitable material may be used, such as, for example without limitation, carbon, phosphorus, and tungsten. For example, in some embodiments the barrier can be a nickel-tungsten/nickel/nickel-tungsten barrier layer. Additionally, in some embodiments, the barrier layer can have two or more alloy layers, wherein the alloy layers have different minor constituents. For example, in some embodiments the barrier layer is a nickel-boron/nickel/nickel-tungsten barrier layer.

In embodiments in which at least one barrier layer is graded, the change in percent of the minor constituent from a first location in the layer to a second location in the layer can be from about 0 to about 49%. In some embodiments the grade is from about 0% to about 10%. In some embodiments it is from about 0% to about 9%, from about 0% to about 8%, from about 0% to about 7%, from about 0% to about 6%, from about 0% to about 5%, from about 0% to about 4%, from about 0% to about 3%, from about 0% to about 2%, or from about 0% to about 1%. These exemplary changes in percentage are not intended to be limiting and other percentages can be used. For example, a boron concentration could vary from about 10% to about 30% throughout a thickness of the layer.

In alternative embodiments in which there are more than one alloy layer in the barrier layer, one of the layers can have a uniform concentration of a minor constituent while a second layer has a varying concentration of the same or a different minor constituent. For example, in the embodiment in FIG. 5B, first layer 264 can be an alloy and have a uniform concentration of a minor constituent throughout, while third layer 268 can have a graded concentration of the same or different minor constituent. In one exemplary embodiment shown in FIG. 5B, layer 264 is a nickel-boron alloy with 5% boron, while layer 268 is a boron-nickel alloy whose boron concentration varies from about 1% at the bottom of the layer to about 5% at the top of the layer.

In some embodiments the thickness of the total barrier layer is about 0.01 to about 1.5 microns, compared to traditional barrier layers whose thickness can be about 1.5 microns to about 5 microns or more. That is, in exemplary embodiments in FIGS. 4A-5B, overall barrier structures 210, 225, 247, and 272, respectively, can be about 0.01 microns to about 1.5 microns in thickness. In some embodiments a discrete layer within the barrier that is a non-alloy layer (e.g., a nickel layer) is about 5 nm to about 200 nm thick, and in some embodiments is about 5 nm to about 50 nm thick. For example, in the embodiment in FIG. 4A, first layer 204 can be a nickel layer flash deposited on substrate 202, and is about 5 nm to about 50 nm thick. In embodiments in which there are more than one non-alloy layer, each of those layers can be about 5 nm to about 50 nm thick. For example, in the embodiment in FIG. 4B, each of layers 224 and 228 within barrier layer 225 can be about 5 nm to about 50 nm.

In some embodiments the alloy barrier layers are between about 30 nm thick and about 800 nm thick. In some embodiments an individual alloy layer is between about 100 nm and about 700 nm thick. In some embodiments they are between about 200 nm and about 600 nm thick. In some embodiments the alloy layer is between about 300 nm and about 500 nm thick. In an exemplary embodiment an alloy layer is about 400 nm thick, such as in layer 156 in the embodiment in FIG. 11A described below. In some embodiments the alloy barrier layers are about 20 nm to about 200 nm thick.

In a merely exemplary embodiment of the structure disclosed in FIG. 5B, layer 264 is between about 20 nm and 200 nm, layer 266 is between about 5 nm and about 50 nm, and layer 268 is between about 20 nm and about 200 nm. The total thickness of layer 272 is between about 45 nm and about 450 nm.

Figure 7A:
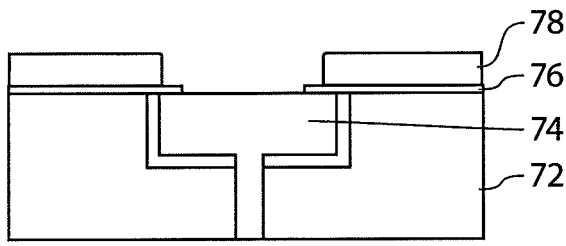
FIGS. 7A-7B illustrate an exemplary process of plating a connector that includes depositing a barrier layer.
Figure 7B:
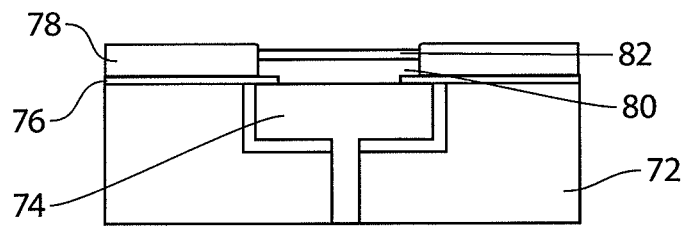

The disclosure also includes methods of preparing an electrical connection, including the barrier layers described herein. FIGS. 7A and 7B illustrate an exemplary method of preparing an electrical connection with a barrier layer that comprises a graded alloy layer. In FIG. 7A, substrate 74 has been deposited in dielectric 72. Passivation layer 76 and polymer 78 are then deposited. Polymer 78 is then lithographically patterned, polymer 78 is cured, and portions of passivation layer 76 are removed by RIE methods to expose substrate 74 beneath, as shown in FIG. 7A. In FIG. 7B, graded alloy layer 80 (e.g., a graded NiB layer) is selectively coated over exposed substrate 74. Conductive material 82 is then coated over graded alloy layer 80. Conductive material 82 can be immersion coated on alloy layer 80. The connector can be used in myriad electrical applications.

Exemplary methods of depositing a barrier layer (either discrete layers or the entire barrier layer) with a uniform concentration of a minor constituent can be found in U.S. Pat. No. 7,521,128, the disclosure of which is incorporated by reference.

In some embodiments the graded alloy layer is formed by electrolytic plating. The electroplating current density can range from about 5 mA/cm$^2$ to about 200 mA/cm$^2$, but in some exemplary embodiments it is between about 20 and about 100 mA/cm$^2$, while in some embodiments it is about 50 mA/cm$^2$. The current density can be modulated to control the concentration of a first minor constituent within the barrier layer. In some embodiments nitrogen and oxygen are bubbled into the solution during the plating process to control the gradient within the barrier layer. For higher levels of a minor constituent (e.g., boron), the amount of nitrogen that is bubbled into the plating solution is increased, while for higher levels of a major constituent (e.g., nickel), the amount of oxygen that is bubbled into solution is increased. By varying the concentration of nitrogen and oxygen bubbled into solution the gradient of the alloy can be controlled during the plating process. Electroless plating processes can also be used to plate a graded alloy barrier layer.

Figure 8A:
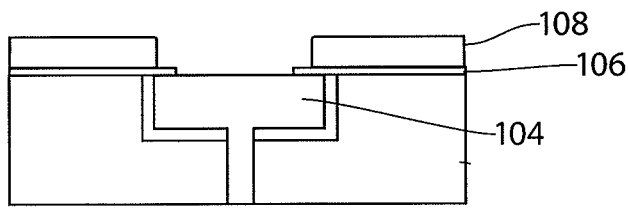
FIGS. 8A-8C illustrate an exemplary process of plating a wire bond including a barrier layer
Figure 8B:
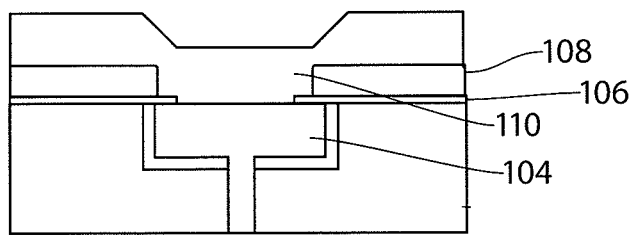
Figure 8C:
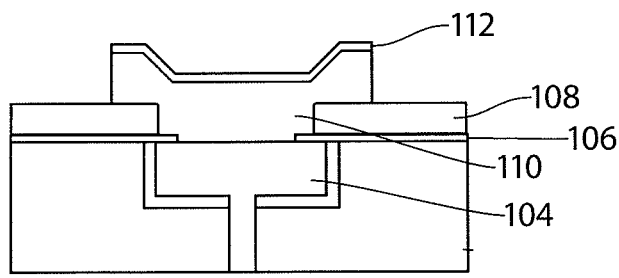

FIGS. 8A-8C illustrate an exemplary method of producing a wire bond that incorporates one or more barrier layers within. In FIG. 8A, polymer 108 has been lithographically patterned, cured, and a portion of passivation layer 106 has been removed by RIE methods to expose substrate 104 beneath. Next as shown in FIG. 8B, barrier layer 110 is globally coated over polymer 108 and substrate 104. Barrier layer 110 can be any of the barrier layers described herein, such as a laminated barrier layer, a graded barrier layer, or any combination thereof. In an exemplary embodiment, barrier layer 110 is a nickel-boron alloy. Next, in Step 8C, barrier layer 110 is patterned to remove unwanted barrier layer material. The substrate may be annealed to reduce resistivity. Conductive layer 112, such as a gold layer or a gold alloy layer, is then selectively deposited on barrier layer 110. Conductive layer 112 can be deposited by immersion deposition. A wire can then be bonded to the wire bond pad as shown in FIG. 8C.

Figure 9A:
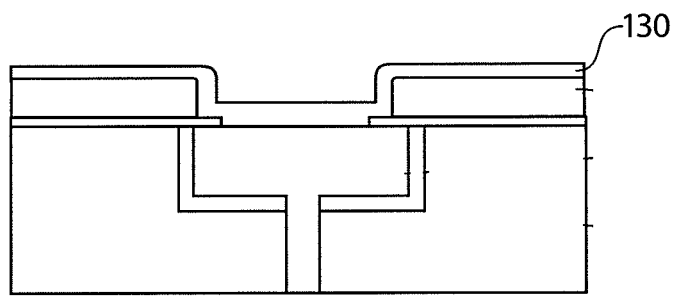
FIGS. 9A-9D illustrate an exemplary process of plating exemplary solderable structures.
Figure 9B:
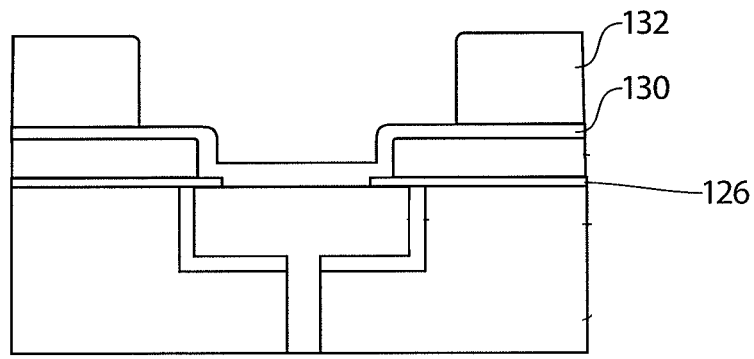
Figure 9C:
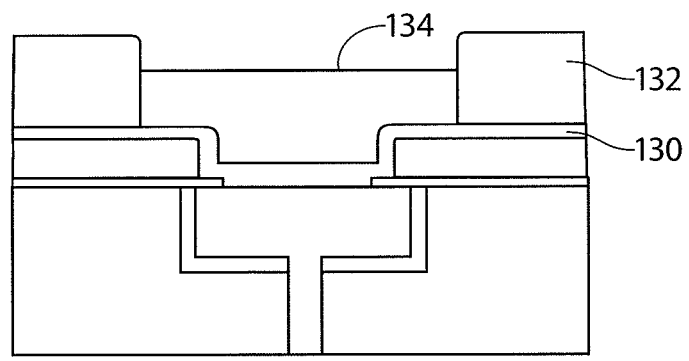
Figure 9D:
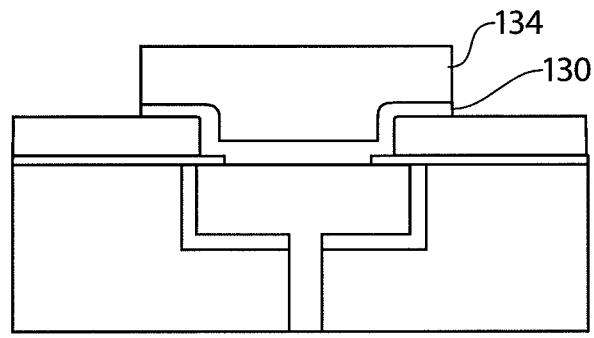

FIGS. 9A-9D illustrate an exemplary method of manufacturing and use of any of the barrier layers herein in a solderable structure. In FIG. 9A, barrier layer 130 is coated as three discrete layers, such as in the embodiment in FIG. 4B. For example, barrier layer 130 can be a Ni/Ni-alloy/Ni barrier layer. Next, resist material 132 is coated and patterned, as shown in FIG. 9B. In FIG. 9C, solderable material is thru-mask plated on barrier layer 130. In this embodiment the conductive layer is the solderable material. In FIG. 9D, resist material 132 is stripped and unwanted portions of barrier layer 130 are removed, exposing solderable material 134. In some embodiments conductive material can be screen printed into the cavities in the resist. In other embodiments, molten solder may be filled into the gaps.

Figure 10A:
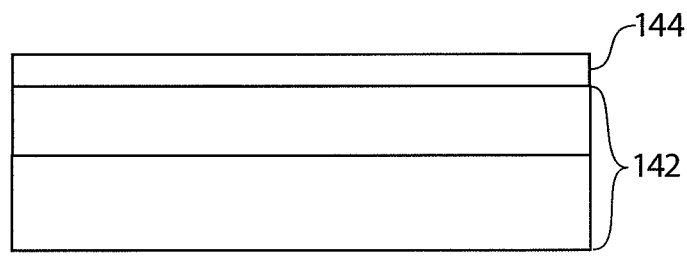
FIGS. 10A-10B illustrate exemplary connector structures including a barrier layer.
Figure 10B:
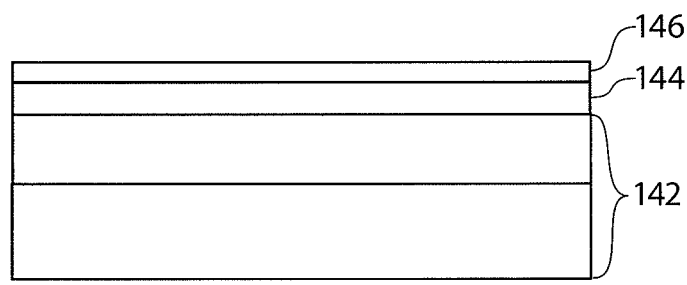

In FIGS. 10A and 10B, barrier layer 144 has been disposed on substrate 142. Barrier layer 144 can be any barrier layer described herein, such as a laminated barrier layer, with at least one layer being an alloy layer with a uniform concentration of a minor constituent. In FIG. 10B, conductive layer 146 has been coated on barrier layer 146. In an exemplary embodiment, gold is the conductive layer that is coated over a barrier layer with at least one layer that is nickel-boron with a varying concentration of boron throughout at least a portion of the alloy layer.

Figure 11A:
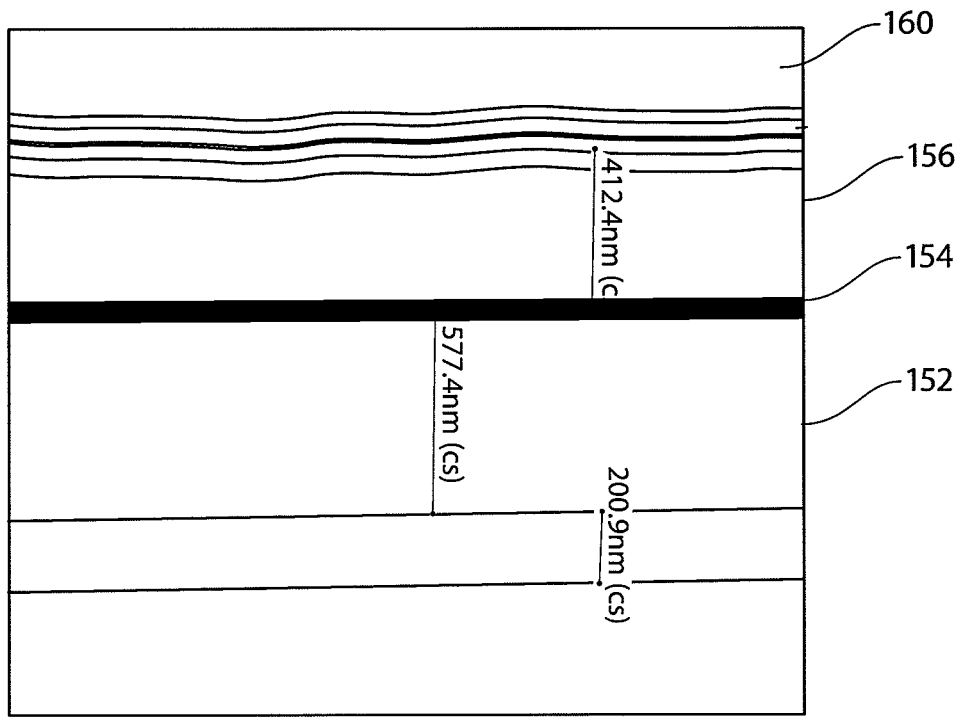
FIGS. 11A-12 show scanning electron microscope images of exemplary barrier layers.
Figure 11B:
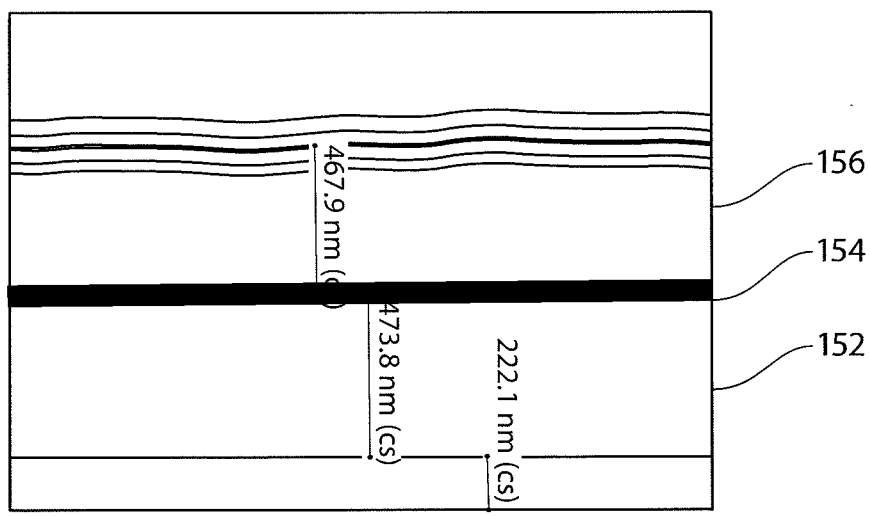

FIG. 11A shows a scanning electron microscope ("SEM") section of a portion of an electrical connector including substrate 152, first barrier layer 154, and second barrier layer 156, as deposited. In this embodiment, substrate 152 is a layer of copper, first barrier layer 154 is a flash layer of nickel, while second layer 156 is a nickel-boron alloy layer with the boron being uniformly distributed throughout second layer 156. As set forth above, boron generally provides better corrosion resistance for the substrate, but higher boron concentrations can cause the connector to be brittle and undesirably crack more easily. The nickel layer 154, immediately adjacent substrate 152, does not contain boron, which helps prevent the connection from cracking. While the flash layer of nickel can help minimize the risk of cracking, it need not be present and in some applications may not be needed or even helpful. In the embodiment in FIG. 11A, the thicknesses as measured using SEM are about 412 nm for layer 156, about 50-100 nm for layer 154, and about 575 nm for layer 152. FIG. 11B shows a SEM section of the section from FIG. 11A after 10 reflow cycles at 300° C. Layer 156 is about 475 nm thick, layer 154 is between about 50 nm and 100 nm thick, and layer 152 is about 470 nm thick.

Figure 12:
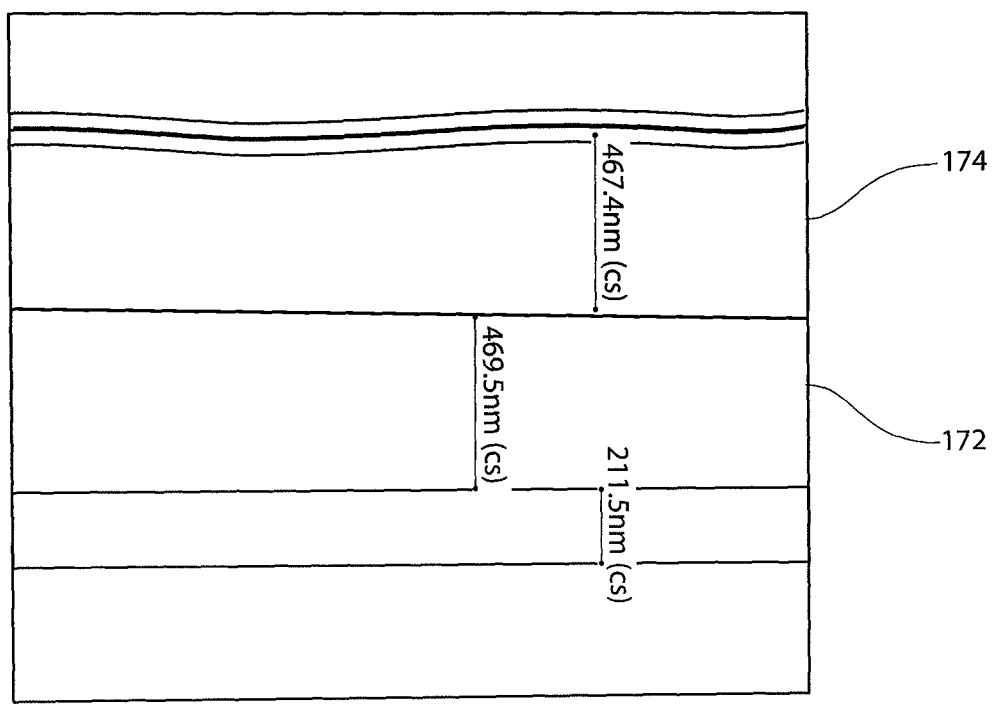

FIG. 12 shows a SEM section of a portion of an exemplary connection after 10 reflows cycle at 300° C. including substrate 172 and barrier layer 174. Barrier layer 174 is a nickel-boron alloy with a uniform concentration of boron throughout. Layer 174 is about 465 nm thick and layer 172 is about 470 nm thick. In FIG. 12, the copper substrate grain size is larger than the grain size of the copper in the embodiment in FIG. 11A.

The embodiments in FIGS. 11A, 11B, and 12 are illustrative only and the actual thicknesses may vary. For example, in many applications barrier layer 156 would be thinner than shown. In some embodiments layer 156 would be less than half of the thickness shown, and could be about ⅙ of the thickness shown.

Any of the barrier layers described herein can be incorporated into the devices described in U.S. Pub. No. 2009/0065907, filed Jul. 31, 2008, the disclosure of which is incorporated herein by reference.

Additionally, the barrier layers described herein can be used in place of, or in addition to, any of the barrier layers described in U.S. patent application Ser. No. 13/183,920, entitled "Connector Structures and Methods," filed on Jul. 15, 2011, the disclosure of which is incorporated by reference herein.

Another merely exemplary use of the barrier layers described herein is in a light emitting diode ("LED"), such as in the semiconductor die of a LED. The barrier layers herein can be used as a barrier between, for example, an aluminum layer and a copper layer.

While preferred embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein may be employed in practicing the embodiments in the disclosure.

The invention claimed is:

1. A device comprising an electrical connection structure comprising:
   a conductive substrate;
   a variable-composition nickel alloy layer above the conductive substrate and in electrical contact with the conductive substrate, the variable-composition nickel alloy layer having a bottom surface overlying and physically contacting a first surface of a first material, and having a top surface underlying and physically contacting a second surface of a second material, wherein the first and second materials do not have nickel as a major constituent, the variable-composition nickel alloy layer comprising a minor constituent selected from a group consisting of boron, carbon, phosphorus, and tungsten, wherein at least over a portion of the conductive substrate, the concentration of the minor constituent decreases throughout the variable-composition nickel alloy layer in a direction from the bottom surface of the variable-composition nickel alloy layer to the top surface of the variable-composition nickel alloy layer; and
   a conductive layer disposed above the variable-composition nickel alloy layer and in electrical contact with the variable-composition nickel alloy layer and the conductive substrate.

2. A device comprising an electrical connection structure comprising:
   a conductive substrate whose top surface does not include nickel as a major constituent;
   a variable-composition nickel alloy layer on the conductive substrate, the variable-composition nickel alloy layer comprising a minor constituent selected from a group consisting of boron, carbon, phosphorus, and tungsten, wherein at least over a portion of the conductive substrate, the concentration of the minor constituent decreases throughout the variable-composition nickel alloy layer in a direction from the bottom surface of the variable-composition nickel alloy layer to the top surface of the variable-composition nickel alloy layer; and
   a conductive layer on the variable-composition nickel alloy layer, the conductive layer having a bottom surface which does not include nickel as a major constituent.

* * * * *